United States Patent
Gozzini et al.

(10) Patent No.: US 9,613,246 B1
(45) Date of Patent: Apr. 4, 2017

(54) MULTIPLE SCAN ELEMENT ARRAY ULTRASONIC BIOMETRIC SCANNER

(71) Applicant: Apple Inc., Cupertino, CA (US)

(72) Inventors: Giovanni Gozzini, Cupertino, CA (US); Matthew E. Last, Cupertino, CA (US); Brian Michael King, Cupertino, CA (US); Marduke Yousefpor, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 276 days.

(21) Appl. No.: 14/487,253

(22) Filed: Sep. 16, 2014

(51) Int. Cl.
*H01L 41/22* (2013.01)
*G06K 9/00* (2006.01)
*H01L 41/25* (2013.01)

(52) U.S. Cl.
CPC ............ *G06K 9/0002* (2013.01); *H01L 41/25* (2013.01)

(58) Field of Classification Search
CPC .......................... G01N 29/2437; H01L 41/22
USPC ................. 73/625, 626, 628, 641, 632, 633; 310/322, 334
See application file for complete search history.

(56) References Cited

U.S. PATENT DOCUMENTS

| | | | |
|---|---|---|---|
| 4,729,128 A * | 3/1988 | Grimes | G01S 15/89 235/380 |
| 5,162,618 A | 11/1992 | Knowles | |
| 5,515,298 A | 5/1996 | Bicz | |
| 5,589,636 A | 12/1996 | Bicz | |
| 5,719,950 A | 2/1998 | Osten | |
| 6,091,406 A | 7/2000 | Kambara | |
| 6,159,149 A | 12/2000 | Erikson | |
| 6,720,712 B2 | 4/2004 | Scott | |
| 7,400,750 B2 * | 7/2008 | Nam | G06K 9/0002 382/124 |
| 7,458,268 B2 | 12/2008 | Schneider et al. | |
| 7,497,120 B2 | 3/2009 | Schneider et al. | |
| 7,568,391 B2 | 8/2009 | Schneider et al. | |
| 7,656,932 B2 | 2/2010 | Durand | |
| 7,667,374 B2 | 2/2010 | Aono et al. | |
| 7,734,435 B2 | 6/2010 | Thomas et al. | |
| 7,739,912 B2 | 6/2010 | Schneider et al. | |
| 7,770,456 B2 | 8/2010 | Stevenson et al. | |
| 8,047,995 B2 | 11/2011 | Wakabayashi et al. | |
| 8,085,998 B2 | 12/2011 | Setlak et al. | |
| 8,095,328 B2 | 1/2012 | Thomas et al. | |

(Continued)

FOREIGN PATENT DOCUMENTS

WO WO 94/02911 2/1994

*Primary Examiner* — Michael A Lyons
*Assistant Examiner* — Suman K Nath
(74) *Attorney, Agent, or Firm* — Brownstein Hyatt Farber Schreck, LLP

(57) ABSTRACT

An ultrasonic biometric scanner includes an ultrasonic multiple scan element array with multiple scan elements. The array includes piezoelectric material such as lead zirconate titanate or polyvinylidene difluoride with a first electrode on a first surface and a second electrode on a second, opposite surface. At least one of the first electrode or the second electrode include multiple electrodes wherein the number of the multiple electrodes corresponds to a number of the multiple scan elements. A substrate is electrically coupled to the second electrode and/or the first electrode. A cover may be positioned over the first electrode. The cover has an acoustic impedance matching ultrasonic signals emitted by the piezoelectric material.

20 Claims, 6 Drawing Sheets

(56) References Cited

U.S. PATENT DOCUMENTS

| | | | |
|---|---|---|---|
| 8,201,739 B2 * | 6/2012 | Schneider | G06K 9/0002 235/439 |
| 8,335,356 B2 | 12/2012 | Schmitt | |
| 8,601,876 B2 | 12/2013 | Schneider et al. | |
| 8,617,078 B2 | 12/2013 | Machida et al. | |
| 8,666,126 B2 | 3/2014 | Lee et al. | |
| 8,724,869 B2 | 5/2014 | Schneider et al. | |
| 8,781,180 B2 | 7/2014 | Schneider et al. | |
| 8,791,792 B2 | 7/2014 | Benkley, III | |
| 8,982,089 B2 | 3/2015 | Lim | |
| 9,044,171 B2 | 6/2015 | Venkatraman et al. | |
| 9,056,082 B2 | 6/2015 | Liautaud et al. | |
| 9,100,034 B2 | 8/2015 | Oshima | |
| 9,170,668 B2 | 10/2015 | Schneider et al. | |
| 2003/0102777 A1 * | 6/2003 | Kuniyasu | B06B 1/0629 310/334 |
| 2003/0109993 A1 | 6/2003 | Peat et al. | |
| 2004/0140735 A1 | 7/2004 | Scott et al. | |
| 2005/0193823 A1 * | 9/2005 | Amano | G06K 9/0002 73/704 |
| 2006/0196271 A1 | 9/2006 | Jancsik et al. | |
| 2008/0142571 A1 * | 6/2008 | Yokozuka | H05K 1/144 228/110.1 |
| 2008/0157940 A1 * | 7/2008 | Breed | B60C 11/24 340/425.5 |
| 2009/0167704 A1 | 7/2009 | Terlizzi et al. | |
| 2010/0265663 A1 * | 10/2010 | Yamashita | H01L 23/552 361/715 |
| 2011/0056737 A1 * | 3/2011 | Hagiwara | H01G 2/10 174/260 |
| 2011/0071397 A1 * | 3/2011 | Wodnicki | B06B 1/0629 600/459 |
| 2011/0163630 A1 * | 7/2011 | Klootwijk | B06B 1/0292 310/300 |
| 2012/0092026 A1 | 4/2012 | Liautaud et al. | |
| 2013/0015868 A1 | 1/2013 | Peng | |
| 2013/0201134 A1 * | 8/2013 | Schneider | G06F 3/041 345/173 |
| 2014/0333328 A1 | 11/2014 | Nelson et al. | |
| 2014/0352440 A1 * | 12/2014 | Fennell | G01N 29/22 73/632 |
| 2014/0354596 A1 * | 12/2014 | Djordjev | G06K 9/0002 345/175 |
| 2014/0359757 A1 | 12/2014 | Sezan et al. | |
| 2015/0053006 A1 | 2/2015 | DeCoux et al. | |
| 2015/0189136 A1 * | 7/2015 | Chung et al. | |
| 2015/0192547 A1 | 7/2015 | Lee et al. | |
| 2015/0358740 A1 * | 12/2015 | Tsai | G01N 29/36 73/632 |
| 2016/0063300 A1 | 3/2016 | Du et al. | |

* cited by examiner

MULTIPLE SCAN ELEMENT ARRAY ULTRASONIC BIOMETRIC SCANNER

TECHNICAL FIELD

This disclosure relates generally to biometrics, and more specifically to a multiple scan element array ultrasonic biometric scanner.

BACKGROUND

Biometrics refers to metrics related to user characteristics and traits. Biometric scans, such as fingerprint or palm print scans, are sometimes used to identify and/or authenticate users. For example, an electronic device may be associated with a particular user and the electronic device may verify that a current user is the particular user in order to allow operation by obtaining and analyzing the current user's fingerprint.

A biometric scanner such as a fingerprint scanner may be used to obtain a user's biometric information. For example, a biometric scanner such as a fingerprint or palm print scanner may capture one or more images of a user's fingertip, palm, or other body part and interpret the image(s) to create a map of the ridges and valleys of the user's fingerprint, palm, or other body part. Such a map may then be compared to stored information in an attempt to authenticate the user.

SUMMARY

The present disclosure discloses apparatuses, systems, and methods related to multiple scan element array ultrasonic biometric scanners. An ultrasonic biometric scanner may include an ultrasonic multiple scan element array with multiple scan elements having piezoelectric material (such as lead zirconate titanate or polyvinylidene difluoride) with a first electrode on a first surface and a second electrode on a second, opposite surface. At least one of the first electrode or the second electrode include multiple electrodes wherein the number of the multiple electrodes corresponds to a number of the multiple scan elements. In some implementations, notches in the first or second surfaces may separate the multiple electrodes and/or the piezoelectric material may be a number of separate piezoelectric elements. A substrate may be electrically coupled to the second electrode and/or the first electrode and a cover may be positioned over the first electrode. The cover may have an acoustic impedance matching ultrasonic signals emitted by the piezoelectric material. As such, the ultrasonic biometric scanner may be capable of obtaining more accurate biometric scans, such as fingerprint scans, than non-multiple scan element ultrasonic biometric scanners while being capable of occupying a smaller space.

In various embodiments, an ultrasonic biometric scanner may include an ultrasonic multiple scan element array having multiple scan elements. The ultrasonic multiple scan element array may include piezoelectric material having a first surface and a second surface opposing the first surface; a first electrode positioned on the first surface; and a second electrode positioned on the second surface. At least one of the first electrode or the second electrode may include multiple electrodes wherein the number of the multiple electrodes corresponds to a number of the multiple scan elements. The ultrasonic biometric scanner may further include a substrate electrically coupled to the second electrode and a cover positioned over the first electrode. The ultrasonic biometric scanner may be operable to obtain a biometric scan of a body part via the cover by causing the piezoelectric material to emit an ultrasonic signal. The cover may have an acoustic impedance matching the ultrasonic signal.

In some embodiments, an electronic device may have an exterior surface having an interior portion and an exterior portion and an ultrasonic biometric scanner. The ultrasonic biometric scanner may include an ultrasonic multiple scan element array having multiple scan elements that includes piezoelectric material having a first surface and a second surface opposing the first surface; a first electrode positioned on the first surface; and a second electrode positioned on the second surface. At least one of the first electrode or the second electrode may include multiple electrodes wherein the number of the multiple electrodes corresponds to a number of the multiple scan elements. The ultrasonic biometric scanner may also include a substrate electrically coupled to the second electrode and a cover positioned over the first electrode, the cover coupled to the interior portion of the exterior surface. The ultrasonic biometric scanner may be operable to obtain a biometric scan of a body part via the exterior surface by causing the piezoelectric material to emit an ultrasonic signal. The cover may have an acoustic impedance matching the ultrasonic signal. The exterior surface may have an acoustic impedance matching the ultrasonic signal.

In one or more embodiments, a method for assembling an ultrasonic biometric scanner may include: forming an ultrasonic multiple scan element array including multiple scan elements by positioning a first electrode on a first surface of piezoelectric material and a second electrode on a second surface of the piezoelectric material opposing the first surface, at least one of the first electrode or the second electrode include multiple electrodes wherein the number of the multiple electrodes corresponds to a number of the multiple scan elements; electrically coupling a substrate to the number of second electrodes; and positioning a cover over the first electrode, the cover having an acoustic impedance matching an ultrasonic signal the piezoelectric material is operable to emit to obtain a biometric scan of a body part via the cover.

It is to be understood that both the foregoing general description and the following detailed description are for purposes of example and explanation and do not necessarily limit the present disclosure. The accompanying drawings, which are incorporated in and constitute a part of the specification, illustrate subject matter of the disclosure. Together, the descriptions and the drawings serve to explain the principles of the disclosure.

DETAILED DESCRIPTION

The description that follows includes sample apparatuses, systems, and methods that embody various elements of the present disclosure. However, it should be understood that the described disclosure may be practiced in a variety of forms in addition to those described herein.

The present disclosure discloses apparatuses, systems, and methods related to multiple scan element array ultrasonic biometric scanners. An ultrasonic biometric scanner may include an ultrasonic multiple scan element array with multiple scan elements having piezoelectric material with a first electrode on a first surface and a second electrode on a second, opposite surface. At least one of the first electrode or the second electrode may include multiple electrodes wherein the number of the multiple electrodes corresponds to a number of the multiple scan elements. A substrate may be electrically coupled to the second electrode and/or the first electrode and a cover may be positioned over the first electrode. The cover may have an acoustic impedance matching ultrasonic signals emitted by the piezoelectric material. As such, the ultrasonic biometric scanner may be capable of obtaining more accurate biometric scans, such as fingerprint scans, than non-multiple scan element ultrasonic biometric scanners while being capable of occupying a smaller space.

In various implementations, the piezoelectric material may be a material such as lead zirconate titanate (PZT) or polyvinylidene difluoride (PVDF). In some implementations, notches may be formed in the first or second surfaces. Such notches may separate the multiple electrodes. In various implementations, the piezoelectric material may be formed of a number of piezoelectric elements than may correspond to the number of multiple scan elements. Such elements may be laminated and/or otherwise adhered together. In such an implementation, each element may include separate first and second electrodes.

In some implementations, such as implementations where the piezoelectric material is PVDF, the piezoelectric material may not include a dedicated second electrode. In such implementations, the piezoelectric material may directly overlay conductive portions of the substrate, such as contact pads, and such conductive portions may constitute the second electrode.

The substrate may be configured to absorb the emitted ultrasonic signal. In some implementations, the substrate may be an application specific integrated circuit. The substrate may be coupled to an electrical connector such as a flex circuit and/or a stiffener such as a plastic stiffener. In some implementations, the stiffener may be configured to absorb the emitted ultrasonic signal.

In various implementations, the ultrasonic biometric scanner may be incorporated into an electronic device. In such implementations, the cover may be coupled to an interior portion of an exterior surface of the electronic device, such as a cover glass.

Figure 1:
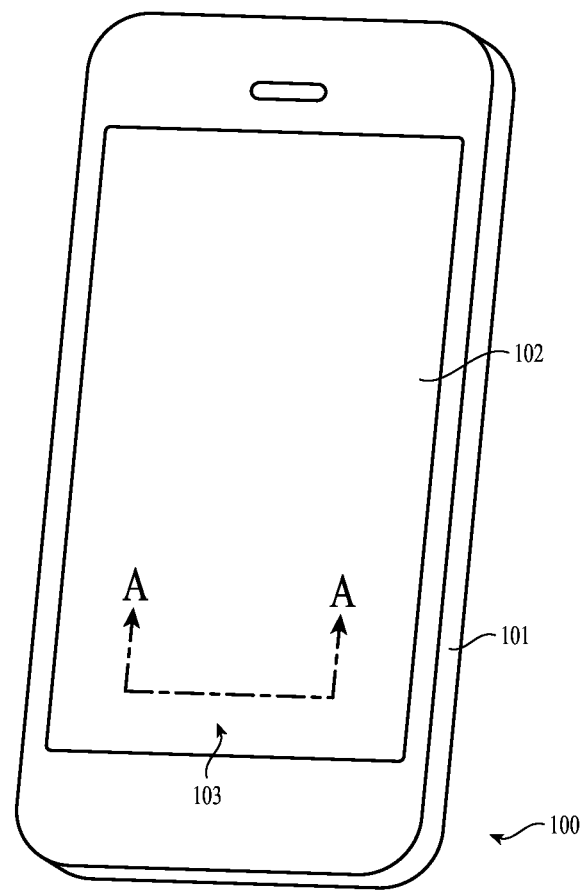
FIG. 1 is an isometric view of an example system for biometric scanning using a multiple scan element array ultrasonic biometric scanner.

FIG. 1 is an isometric view of an example system 100 for biometric scanning using a multiple scan element array ultrasonic biometric scanner. As illustrated, the example system includes a electronic device 101 with an exterior surface 102 that is configured with an area 103 for scanning fingerprints.

However, though the electronic device 101 is illustrated as a smart phone, it is understood that this is an example. In various implementations, the electronic device may be any kind of electronic device such as a cellular telephone, a laptop computer, a mobile computer, a digital media player, a desktop computer, a tablet computer, an accessory, a charging dock, a wearable device, and/or any other kind of electronic device without departing from the scope of the present disclosure.

Further, although the exterior surface 102 is illustrated as a cover glass, it is understood that this is an example. In various implementations, the exterior surface may be any kind of exterior surface such as a touch screen, a button, a touch pad, a housing (such as a plastic or metal housing portion), and/or any other kind of exterior surface without departing from the scope of the present disclosure.

Additionally, although the area 103 is described as configured for scanning fingerprints, it is understood that this is an example. In various implementations, the area may be configured for scanning any kind of body part such as palm prints, footprints, and/or any other kind of body part without departing from the scope of the present disclosure. Further, although the area is shown as being located on a particular place on the electronic device 101 and having a particular shape and dimensions, it is understood that this is an example. In various implementations, the area may be located substantially anywhere on the electronic device and have any suitable shape and/or dimensions.

Figure 2:
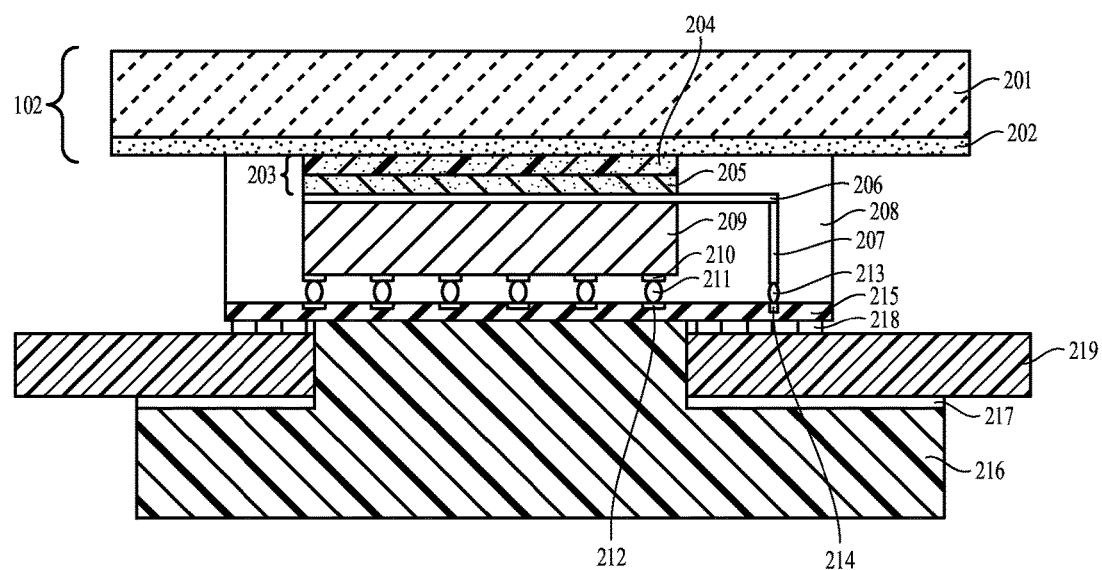
FIG. 2 is a cross sectional view of a first example ultrasonic biometric scanner that may be used in the example system of FIG. 1 taken along the line A-A of FIG. 1.
Figure 4:
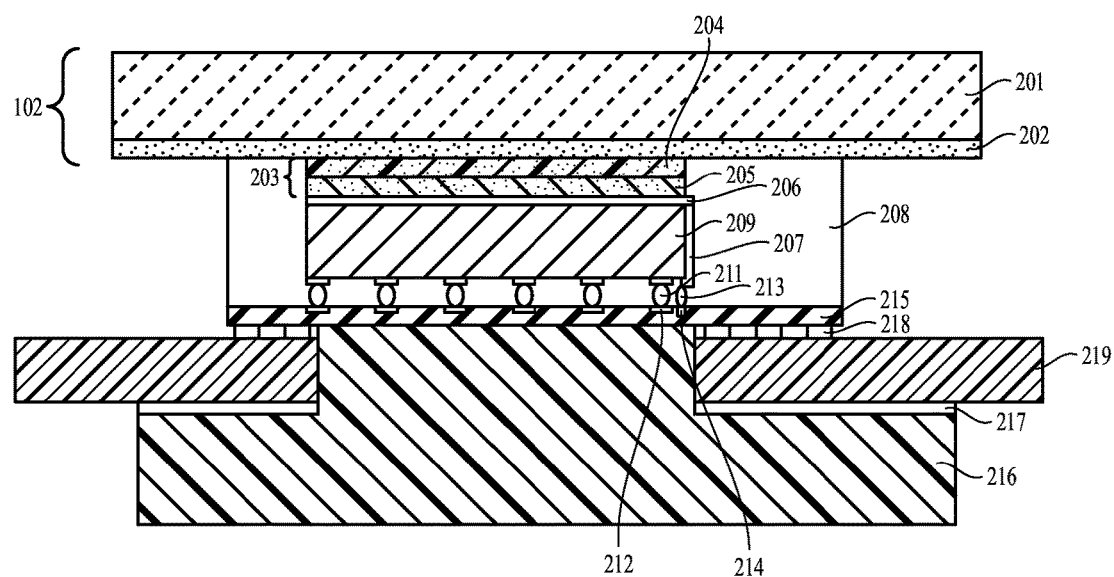
FIG. 4 is a cross sectional view of a second example ultrasonic biometric scanner that may be used in the example system of FIG. 1 taken along the line A-A of FIG. 1.
Figure 5:
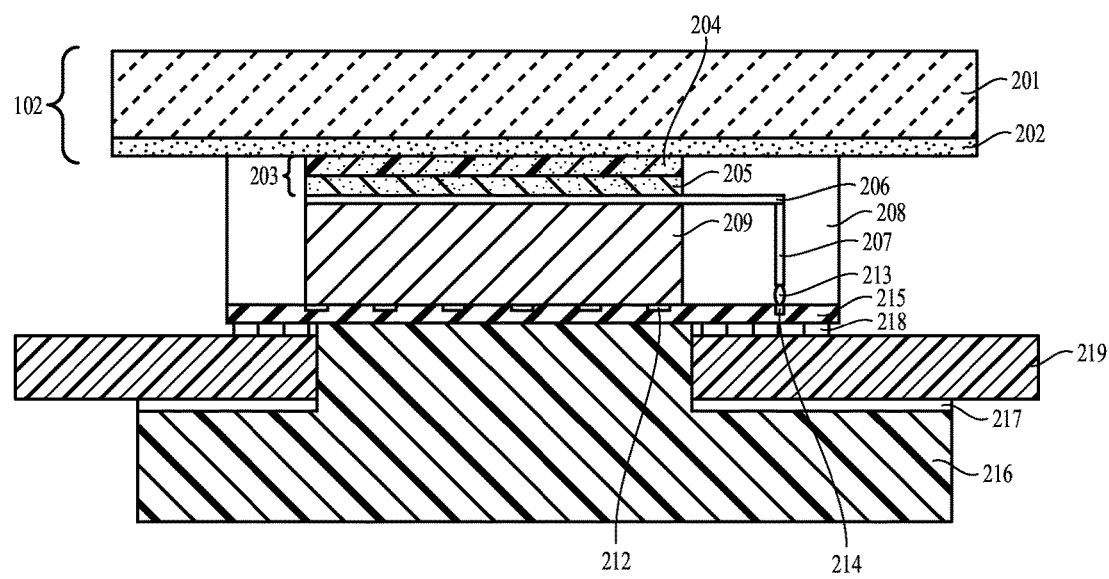
FIG. 5 is a cross sectional view of a third example ultrasonic biometric scanner that may be used in the example system of FIG. 1 taken along the line A-A of FIG. 1.

The electronic device 101 may include an ultrasonic biometric scanner, which may be a multiple scan element array ultrasonic biometric scanner, positioned within the electronic device under the area 103 (see for example FIGS. 2, 4, and 5). Such an ultrasonic biometric scanner may utilize piezoelectric material to produce ultrasonic signals. Materials between the piezoelectric material and the exterior portion of the area may have an acoustic impedance matching the ultrasonic signals such that the ultrasonic signals emitted from the piezoelectric material to the exterior portion of the area. However, air and/or an object touching the exterior portion of the area, such as a fingertip and/or other body part of a user, may have an acoustic impedance mismatched with the ultrasonic signal. As such, when the ultrasonic signal encounters the air or other object, the ultrasonic signal may be directed back toward the piezoelectric material. The piezoelectric material may receive the redirected signal and the redirected signal may be analyzed to determine whether or not an object is touching the exterior portion of the area and/or to determine one or more characteristics of that object, such as ridges and valleys of a user's fingerprint. For example, air may reflect the ultrasonic signal the strongest and the gradation of weaker received redirected signals may indicate ridges and valleys of a user's fingerprint, depth of valleys of a user's fingerprint, and so on. In this way, a biometric scan such as a fingerprint scan of a user may be obtained.

In implementations where the ultrasonic biometric scanner is a multiple scan element array ultrasonic biometric scanner, ultrasonic signals may be emitted and received by individual scan elements of the array that each include piezoelectric material. As such, the ultrasonic biometric scanner may be capable of obtaining more accurate biometric scans, such as fingerprint scans, than non-multiple scan element ultrasonic biometric scanners while being capable of occupying a smaller space. A variety of techniques may be utilized to prevent interference of individual scan elements with each other, examples of which are elaborated below.

The scan elements of the multiple scan element array ultrasonic biometric scanner may be driven in a variety of different patterns of emitting and/or receiving utilizing a variety of different techniques. For example, a wide band sensing technique may cause all scan elements to emit a single sine pulse of any given frequency. One example being 50 MHz. Scan elements may then receive the redirected sine pulse and the received redirected sine pulse may be analyzed based on travel time and amplitude to obtain the results of the scan.

By way of another example, a narrowband sensing technique may cause the scan elements to emit and receive multiple narrowband cycles of sine waves until into a steady state is reached. Once the scan elements are in the steady state, an ultrasonic signal may again be transmitted and received by the scan elements, which may then be analyzed to obtain the results of the scan.

In still another example, various combinations of one or more scan elements of the array may be separately driven to emit and/or receive ultrasonic signals. Such a technique may be performed when an object such as a user's fingerprint is determined to be positioned over part but not all of the array (which may be determined utilizing techniques such as measuring detected capacitance). In this way, energy consumption may be reduced compared to driving all scan elements when not all information obtained utilizing all scan elements would be relevant to a scan.

Additionally, the electronic device 101 may include one or more other components not shown. Such other components may include one or more processing units, one or more communication components, one or more input/output components, one or more user interface components, one or more non-transitory storage media (which may take the form of, but is not limited to, a magnetic storage medium; optical storage medium; magneto-optical storage medium; read only memory; random access memory; erasable programmable memory; flash memory; and so on), and/or various other components.

FIG. 2 is a cross sectional view of a first example ultrasonic biometric scanner that may be used in the example system 100 of FIG. 1 taken along the line A-A of FIG. 1. As illustrated, the ultrasonic biometric scanner may include piezoelectric material 209, which may be a material such as PZT or PVDF. A first electrode 206 may be positioned on a first surface (illustrated in this example as a top surface) of the piezoelectric material and second electrodes 210 may be positioned on a second surface of the piezoelectric material (illustrated as the opposing bottom surface. A cover 203 that has an acoustic impedance matching ultrasonic signals produced by the piezoelectric material may be positioned over the first electrode. As illustrated in this example, the cover may include a layer of glass-filled epoxy 204 and a layer of conductive epoxy 205. The second electrodes may be electrically coupled to conductive portions of a substrate 215 (which may be an application specific integrated circuit), such as via flip chip solder balls 211 and contact pads 212. The first electrode may also be electrically coupled to conductive portions of the substrate, such as via interconnect 207 (which is illustrated as connecting the first electrode to the substrate around the piezoelectric material), flip chip solder ball 213, and contact pad 214.

In some implementations, the second electrodes 210 may correspond to the multiple scan elements of the array. As such, a number of second electrodes may be utilized that corresponds to the number of multiple scan elements. Utilization of separate second electrodes by individual scan elements may aid in reducing and/or preventing ultrasonic signal interference between the individual scan elements of the array.

The cover 203 may be coupled to an interior portion of the exterior surface 102. As illustrated, the cover may be coupled to a cover glass 201 that includes an interior opaque layer 202, such as white, gray, and/or other colored inks.

In various implementations, the substrate 215 may be configured to absorb the ultrasonic signals emitted by the piezoelectric material 209. The piezoelectric material may emit ultrasonic signals in a variety of directions. However, ultrasonic signals that are not transmitted toward and received back from the cover 203 may not be relevant to a biometric scan and may in fact interfere with the ultrasonic signals transmitted toward and received redirected back from the cover. As such, absorption of ultrasonic signals by the substrate may prevent ultrasonic signals not relevant to a biometric scan from interfering with receiving and analysis of ultrasonic signals relevant to a biometric scan.

The substrate 215 may be electrically coupled to another portion of the electronic device 101 via an electrical connector 219. For example, the electrical connector may be a flex circuit and the substrate may be electrically connected thereto via land grid array solder 218. As illustrated, the second electrodes 210 may electrically couple to a first surface of the substrate (illustrated as a top surface) and a second surface (illustrated as the opposing bottom surface) may electrically couple to the electrical connector. In some implementations, the electrical connector may be configured to absorb the ultrasonic signals emitted by the piezoelectric material 209.

In some implementations, the substrate 215 may be coupled to a stiffener 216, which may be formed of plastic and/or any other material. Such a stiffener may provide vertical support, rigidity, and/or other strengthening or support for the substrate, the piezoelectric material, and/or any other component of the ultrasonic biometric scanner. As illustrated, a first portion of the second surface of the substrate opposite the contact pads 212 is coupled to the stiffener and another portion outside that first portion is coupled to the electrical connector 219, the electrical connector then being coupled to the stiffener via a connection mechanism 217 such as pressure sensitive adhesive. However, it is understood that this is an example and other configurations are possible and contemplated without departing from the scope of the present disclosure. In various implementations, the stiffener may be configured to absorb the ultrasonic signals emitted by the piezoelectric material 209.

As illustrated, an encapsulant 208 may surround one or more portions of the substrate 215, the piezoelectric material 209, the cover 203, and so on. Such an encapsulant may isolate various electronic components, provide strength and/or other structural functions, form a barrier against entry of contaminants, and/or perform various other functions.

In some implementations, the capacitance of the first electrode 206 may change when an object such as a user's fingertip is brought proximate to the exterior surface 102. In such implementations, the capacitance of the first electrode may be monitored for such a change and the piezoelectric material 209 may be stimulated to emit the ultrasonic signals upon detection of such a change. In this way, power consumption may be reduced by driving the scan elements when an object to be scanned is determined to be present.

Although FIG. 2 illustrates components with particular dimensions, it is understood that this is an example and not intended to be limiting. Components with a variety of differing dimensions may be utilized without departing from the scope of the present disclosure. Further, one or more layers may be omitted and/or made of a different material and/or one more additional layers may be added without departing from the scope of the present disclosure.

For example, in various implementations the cover glass 201 may be 800 microns thick from the exterior surface to the interior surface where the opaque layer 202 is coupled, the opaque layer may be 50 microns thick, the glass-filled epoxy 204 may be 8 microns thick, the layer of conductive epoxy 205 may be 15 microns thick, the first electrode 206 may be 5 microns thick, the piezoelectric material 209 may be PZT that is 88 microns thick, the substrate may be 200 microns thick, and the stiffener may be 200 microns thick.

However, this again is an example. In various other implementations the piezoelectric material may be PVDF that is 22 microns thick between the first electrode 206 and the second electrodes 210. Further, the thicknesses of the other materials may also be different in various embodiments.

Additionally, although the first example ultrasonic biometric scanner is described above and illustrated in FIG. 2 as including particular components configured in a particular manner, it is understood that this is an example. In various implementations, the same, similar, and/or different components may be configured in a variety of different manners without departing from the scope of the present disclosure.

For example, the first electrode 206 is illustrated and described as a single electrode. However, in various implementations the first electrode may be a number of separate electrodes. In some instances of such an implementation, a separate first electrode may be included for each of the scan elements without departing from the scope of the present disclosure.

By way of another example, the second electrodes are illustrated as multiple separate electrodes. However, in various implementations the second electrodes may be a single, unified second electrode without departing from the scope of the present disclosure.

Figure 3A:
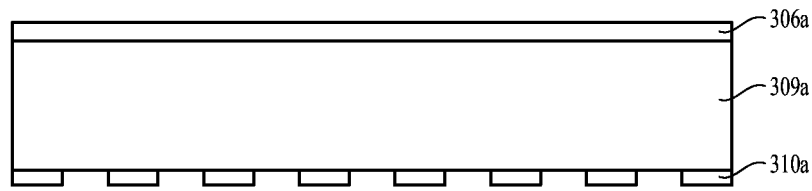
FIG. 3A is a first example of an ultrasonic multiple scan element array that may be utilized in the example ultrasonic biometric scanner of FIG. 2.

FIG. 3A is a first example of an ultrasonic multiple scan element array that may be utilized in the example ultrasonic biometric scanner of FIG. 2. Similar to FIG. 2, a top electrode 306a may be positioned over piezoelectric material 309a (such as PZT or PVDF). Also similar to FIG. 2, bottom electrodes 310a may be positioned under the piezoelectric material. As illustrated, the bottom electrodes are not positioned over the entirety of the bottom surface of the piezoelectric material. This separation between bottom electrodes may aid in reducing and/or preventing ultrasonic signal interference between the individual scan elements of the array.

Figure 3B:
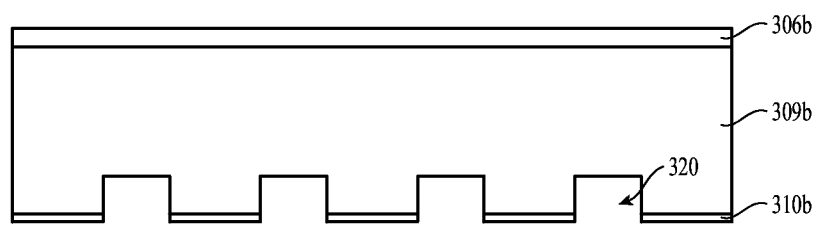
FIG. 3B is a second example of an ultrasonic multiple scan element array that may be utilized in the example ultrasonic biometric scanner of FIG. 2.

FIG. 3B is a second example of an ultrasonic multiple scan element array that may be utilized in the example ultrasonic biometric scanner of FIG. 2. By way of contrast with the first example of ultrasonic multiple scan element array of FIG. 3A, the second example of ultrasonic multiple scan element array may include notches 320 and/or other gaps formed (such as by cutting, grinding, and/or other processes) in the bottom surface of piezoelectric material 309b (such as PZT or PVDF). These notches may aid in reducing and/or preventing ultrasonic signal interference between the individual scan elements of the array.

Figure 3C:
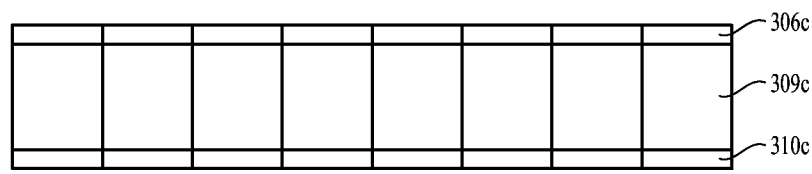
FIG. 3C is a third example of an ultrasonic multiple scan element array that may be utilized in the example ultrasonic biometric scanner of FIG. 2.

FIG. 3C is a third example of an ultrasonic multiple scan element array that may be utilized in the example ultrasonic biometric scanner of FIG. 2. By way of contrast with the first example of ultrasonic multiple scan element array of FIG. 3A, the third example of ultrasonic multiple scan element array may include a number of separate piezoelectric elements (such as PZT or PVDF) 309c instead of a single, unitary piece of piezoelectric material. The number of separate and discrete piezoelectric elements may correspond to the number of multiple scan elements in the array. The separate and discrete piezoelectric elements may be affixed/attached to each other, such as utilizing an adhesive. Further, each piezoelectric element may include a dedicated top electrode 306c and a dedicated bottom electrode 310c. The use of separate piezoelectric elements and/or the use of dedicated top and/or bottom electrodes for each of the separate piezoelectric elements may aid in reducing and/or preventing ultrasonic signal interference between the individual scan elements of the array.

In some implementations, the piezoelectric elements 309c may be formed by cutting or dicing a single piece of piezoelectric material. The cut or diced piezoelectric elements may then be laminated (such as utilizing epoxy) and/or otherwise adhered together.

FIG. 4 is a cross sectional view of a second example ultrasonic biometric scanner that may be used in the example system 100 of FIG. 1 taken along the line A-A of FIG. 1. By way of contrast with FIG. 2, the solder ball 213 and the contact pad 214 are positioned under the piezoelectric material 209 and the interconnect 207 runs along a side of the piezoelectric material as opposed to through the encapsulant 208.

FIG. 5 is a cross sectional view of a third example ultrasonic biometric scanner that may be used in the example system 100 of FIG. 1 taken along the line A-A of FIG. 1. By way of contrast with FIG. 2, the piezoelectric material 209 may be PVDF or other material that may be directly stimulated by contact pads 212. As such, the piezoelectric material may be directly positioned over the contact pads of the substrate 215 without use of interconnect structures such as the second electrodes 210 and/or the solder balls 211. In such an implementation, the contact pads would constitute the second electrodes of the ultrasonic multiple scan element array.

Figure 6:
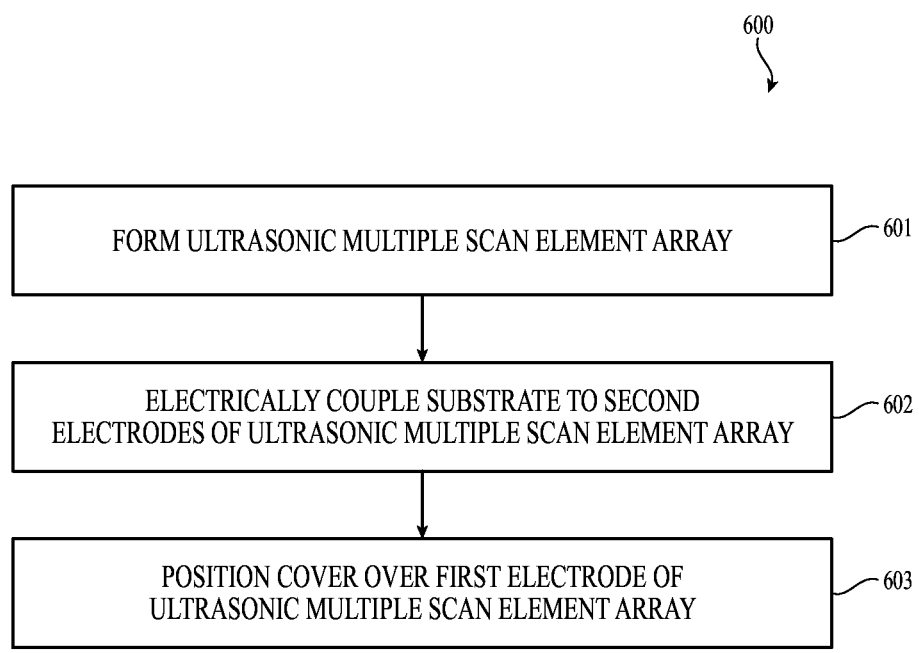
FIG. 6 is a method diagram illustrating an example method for assembling an ultrasonic biometric scanner. This method may assemble the example systems of FIGS. 1-5.

FIG. 6 is a method diagram illustrating an example method for assembling an ultrasonic biometric scanner. This method may assemble the example systems of FIGS. 1-5.

The flow begins at block 601 where an ultrasonic multiple scan element array is formed. The ultrasonic multiple scan element array may include multiple scan elements. The array may be formed by positioning a first electrode on a first surface of piezoelectric material and a number of second electrodes on a second surface that opposes the first surface. The number of second electrodes may correspond to the number of the multiple scan elements.

The flow then proceeds to block 602 where a substrate is electrically coupled to the second electrodes of the ultrasonic multiple scan element array.

Next, the flow proceeds to block 603 where a cover is positioned over the first electrode of the ultrasonic multiple scan element array. The cover may have an acoustic impedance that matches an ultrasonic signal the piezoelectric material is operable to emit to obtain a biometric scan of a body part via the cover.

Although the method 600 is illustrated and described above as including particular operations performed in a particular order, it is understood that this is an example. In various implementations, various orders of the same, similar, and/or different operations may be performed without departing from the scope of the present disclosure.

For example, various implementations may include performance of one or more additional operations. In some implementations, an additional operation of cutting notches into the second surface that separates the second electrodes may be performed without departing from the scope of the present disclosure. In other implementations, additional operations of cutting piezoelectric material into separate piezoelectric elements and laminating the separate piezoelectric elements together utilizing epoxy may be performed without departing from the scope of the present disclosure.

As discussed above and illustrated in the accompanying figures, the present disclosure discloses apparatuses, systems, and methods related to multiple scan element array ultrasonic biometric scanners. An ultrasonic biometric scanner may include an ultrasonic multiple scan element array with multiple scan elements having piezoelectric material with a first electrode on a first surface and a number of second electrodes on a second, opposite surface. The number of second electrodes may correspond to the number of multiple scan elements. A substrate may be electrically coupled to the second electrodes and a cover may be positioned over the first electrode. The cover may have an acoustic impedance matching ultrasonic signals emitted by the piezoelectric material. As such, the ultrasonic biometric scanner may be capable of obtaining more accurate biometric scans, such as fingerprint scans, than non-multiple scan element ultrasonic biometric scanners while being capable of occupying a smaller space.

In the present disclosure, the methods disclosed may be implemented utilizing sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

Techniques of the described disclosure may utilize a computer program product, or software, that may include a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

We claim:

1. An ultrasonic biometric scanner, comprising:
  an ultrasonic multiple scan element array including multiple scan elements, comprising:
    piezoelectric material having a first surface and a second surface opposing the first surface;
    a first electrode positioned on the first surface; and
    a second electrode positioned on the second surface;
  a substrate electrically coupled to the second electrode; and
  a cover positioned over the first electrode;
  wherein:
    at least one of the first electrode or the second electrode include multiple electrodes wherein the number of the multiple electrodes corresponds to a number of the multiple scan elements;
    the substrate is acoustically coupled to the piezoelectric material and configured to absorb the ultrasonic signal; and
    the ultrasonic biometric scanner is operable to obtain a biometric scan of a body part via the cover by causing the piezoelectric material to emit an ultrasonic signal.

2. The system of claim 1, wherein the piezoelectric material comprises one of lead zirconate titanate or polyvinylidene difluoride.

3. The system of claim 1, wherein:
  the second electrode includes the multiple electrodes; and
  the piezoelectric material includes notches in the second surface positioned between the multiple electrodes.

4. The system of claim 1, wherein the piezoelectric material comprises a number of piezoelectric elements corresponding to the number of the multiple scan elements.

5. The system of claim 4, wherein the number of piezoelectric elements are adhered together.

6. The system of claim 4, wherein each of the number of piezoelectric elements includes a separate first electrode.

7. The system of claim 1, wherein both the first electrode and the second electrode comprise multiple electrodes.

8. The system of claim 1, wherein the cover comprises a glass-filled epoxy layer and a conductive epoxy layer.

9. The system of claim 1, further comprising an electrical connector coupled to a first surface of the substrate wherein the substrate is electrically coupled to the second electrode via a second surface that opposes the first surface.

10. The system of claim 9, wherein the electrical connector comprises a flex circuit.

11. The system of claim 1, further comprising a stiffener coupled to a first surface of the substrate wherein the substrate is electrically coupled to the second electrode via a second surface that opposes the first surface.

12. The system of claim 11, wherein the substrate is acoustically coupled to the piezoelectric material, the stiffener is acoustically coupled to the substrate, and the stiffener is configured to absorb the ultrasonic signal.

13. The system of claim 1, further comprising encapsulant positioned over the substrate and around the piezoelectric material.

14. The system of claim 1, wherein the first electrode is electrically coupled to the substrate around the piezoelectric material.

15. The system of claim 1, wherein the substrate comprises an application specific integrated circuit.

16. The system of claim 1, wherein the ultrasonic biometric scanner causes the piezoelectric material to emit the ultrasonic signal in response to detection of a change in capacitance of the first electrode.

17. An electronic device, comprising:
an exterior surface having an interior portion and an exterior portion; and
an ultrasonic biometric scanner, comprising:
an ultrasonic multiple scan element array including multiple scan elements, comprising:
piezoelectric material having a first surface and a second surface opposing the first surface;
a first electrode positioned on the first surface; and
a second electrode positioned on the second surface;
a substrate electrically coupled to the second electrode, the substrate acoustically coupled to the piezoelectric material;
a stiffener acoustically coupled to the substrate; and
a cover positioned over the first electrode, the cover coupled to the interior portion of the exterior surface;
wherein:
at least one of the first electrode or the second electrode include multiple electrodes wherein the number of the multiple electrodes corresponds to a number of the multiple scan elements;
the ultrasonic biometric scanner is operable to obtain a biometric scan of a body part via the exterior surface by causing the piezoelectric material to emit an ultrasonic signal; and
the stiffener is configured to absorb the ultrasonic signal.

18. The electronic device of claim 17, wherein the exterior surface comprises a cover glass with an opaque layer on the interior portion.

19. An ultrasonic biometric scanner, comprising:
an ultrasonic multiple scan element array including multiple scan elements, comprising: piezoelectric material having a first surface and a second surface opposing the first surface;
a first electrode positioned on the first surface; and a second electrode positioned on the second surface; a substrate electrically coupled to the second electrode; and
a cover positioned over the first electrode;
wherein:
the second electrode includes multiple electrodes wherein the number of the multiple electrodes corresponds to a number of the multiple scan elements;
the piezoelectric material includes notches defined in the second surface positioned between the multiple electrodes;
the ultrasonic biometric scanner is operable to obtain a biometric scan of a body part via the cover by causing the piezoelectric material to emit an ultrasonic signal; and
the substrate is acoustically coupled to the piezoelectric material and configured to absorb the ultrasonic signal.

20. The ultrasonic biometric scanner of claim 19, wherein the notches reduce ultrasonic signal interference between the multiple scan elements.

* * * * *